United States Patent
McCormack et al.

(10) Patent No.: US 8,811,526 B2
(45) Date of Patent: Aug. 19, 2014

(54) DELTA MODULATED LOW POWER EHF COMMUNICATION LINK

(75) Inventors: Gary D. McCormack, Tigard, OR (US); Ian A. Kyles, West Linn, OR (US)

(73) Assignee: Keyssa, Inc., Mountain View, CA (US)

( * ) Notice: Subject to any disclaimer, the term of this patent is extended or adjusted under 35 U.S.C. 154(b) by 0 days.

(21) Appl. No.: 13/485,306

(22) Filed: May 31, 2012

(65) Prior Publication Data
US 2012/0307932 A1 Dec. 6, 2012

Related U.S. Application Data

(63) Continuation-in-part of application No. 13/427,576, filed on Mar. 22, 2012.

(60) Provisional application No. 61/491,811, filed on May 31, 2011.

(51) Int. Cl.
| H04L 27/00 | (2006.01) |
| H01Q 9/26 | (2006.01) |
| H01L 23/66 | (2006.01) |
| H01L 23/00 | (2006.01) |
| H01Q 1/22 | (2006.01) |
| H01Q 7/00 | (2006.01) |
| H01L 23/31 | (2006.01) |
| H01L 23/498 | (2006.01) |

(52) U.S. Cl.
CPC ............ *H01L 23/66* (2013.01); *H01L 23/3128* (2013.01); *H01L 2924/09701* (2013.01); *H01L 2224/49* (2013.01); *H01Q 9/26* (2013.01); *H01L 24/49* (2013.01); *H01L 2924/3011* (2013.01); *H01L 23/49816* (2013.01); *H01L 2924/10253* (2013.01); *H01L 2224/48227* (2013.01); *H01L 2224/32225* (2013.01); *H01L 2224/73265* (2013.01); *H01Q 1/2283* (2013.01); *H01L 23/49861* (2013.01); *H01L 2924/15311* (2013.01); *H01Q 7/00* (2013.01)
USPC ............ 375/295; 327/291; 332/106; 341/20; 341/173

(58) Field of Classification Search
USPC .......................................... 375/295
See application file for complete search history.

(56) References Cited

U.S. PATENT DOCUMENTS 3,796,831 A 3/1974 Bauer
3,971,930 A * 7/1976 Fitzmaurice et al. ......... 398/213

(Continued)

FOREIGN PATENT DOCUMENTS

EP 0 515 187 A2 11/1992
EP 1 298 809 A2 4/2003

(Continued)

OTHER PUBLICATIONS

Office of Engineering and Technology Federal Communications Commission, "Understanding the FCC Regulations for Low-Power, Non-Licensed Transmitters", OET Bulletin No. 63, Oct. 1993, 34 pages.

(Continued)

*Primary Examiner* — Chieh Fan
*Assistant Examiner* — Santiago Garcia
(74) *Attorney, Agent, or Firm* — Kolisch Hartwell, P.C.

(57) ABSTRACT

A system for communicating modulated EHF signals may include a modulation circuit responsive to a bi-level transmit information signal for generating a transmit output signal. The transmit output signal may have an EHF frequency when the transmit information signal is at a first information state and may be suppressed when the transmit information signal is at a second information state. A transmit transducer operatively coupled to the modulation circuit may be responsive to the transmit output signal for converting the transmit output signal into an electromagnetic signal.

23 Claims, 7 Drawing Sheets

(56) References Cited

U.S. PATENT DOCUMENTS

| | | | |
|---|---|---|---|
| 4,485,312 A | 11/1984 | Kusakabe et al. | |
| 4,497,068 A | 1/1985 | Fischer | |
| 4,694,504 A | 9/1987 | Porter et al. | |
| 5,199,086 A * | 3/1993 | Johnson et al. | 385/2 |
| 5,543,808 A | 8/1996 | Feigenbaum et al. | |
| 5,621,913 A | 4/1997 | Tuttle et al. | |
| 5,754,948 A | 5/1998 | Metze | |
| 5,773,878 A | 6/1998 | Lim et al. | |
| 5,956,626 A | 9/1999 | Kaschke et al. | |
| 6,351,237 B1 | 2/2002 | Martek et al. | |
| 6,490,443 B1 | 12/2002 | Freeny, Jr. | |
| 6,492,973 B1 | 12/2002 | Kuroki et al. | |
| 6,534,784 B2 | 3/2003 | Eliasson et al. | |
| 6,542,720 B1 | 4/2003 | Tandy | |
| 6,590,544 B1 | 7/2003 | Filipovic | |
| 6,607,136 B1 | 8/2003 | Atsmon et al. | |
| 6,718,163 B2 | 4/2004 | Tandy | |
| 6,915,529 B1 | 7/2005 | Suematsu et al. | |
| 6,967,347 B2 | 11/2005 | Estes et al. | |
| 7,107,019 B2 | 9/2006 | Tandy | |
| 7,213,766 B2 | 5/2007 | Ryan et al. | |
| 7,311,526 B2 | 12/2007 | Rohrbach et al. | |
| 7,512,395 B2 | 3/2009 | Beukema et al. | |
| 7,517,222 B2 | 4/2009 | Rohrbach et al. | |
| 7,593,708 B2 | 9/2009 | Tandy | |
| 7,598,923 B2 | 10/2009 | Hardacker et al. | |
| 7,599,427 B2 | 10/2009 | Bik | |
| 7,612,630 B2 | 11/2009 | Miller | |
| 7,617,342 B2 | 11/2009 | Rofougaran | |
| 7,645,143 B2 | 1/2010 | Rohrbach et al. | |
| 7,656,205 B2 | 2/2010 | Chen et al. | |
| 7,664,461 B2 | 2/2010 | Rofougaran et al. | |
| 7,760,045 B2 | 7/2010 | Kawasaki | |
| 7,761,092 B2 | 7/2010 | Desch et al. | |
| 7,768,457 B2 | 8/2010 | Pettus et al. | |
| 7,769,347 B2 | 8/2010 | Louberg et al. | |
| 7,778,621 B2 | 8/2010 | Tandy | |
| 7,791,167 B1 | 9/2010 | Rofougaran | |
| 7,820,990 B2 | 10/2010 | Schroeder et al. | |
| 7,889,022 B2 | 2/2011 | Miller | |
| 7,907,924 B2 | 3/2011 | Kawasaki | |
| 7,929,474 B2 | 4/2011 | Pettus et al. | |
| 8,014,416 B2 | 9/2011 | Ho et al. | |
| 8,036,629 B2 | 10/2011 | Tandy | |
| 8,041,227 B2 | 10/2011 | Holcombe et al. | |
| 8,063,769 B2 | 11/2011 | Rofougaran | |
| 8,081,699 B2 | 12/2011 | Siwiak et al. | |
| 8,087,939 B2 | 1/2012 | Rohrbach et al. | |
| 8,121,542 B2 | 2/2012 | Zack et al. | |
| 8,183,935 B2 | 5/2012 | Milano et al. | |
| 8,244,179 B2 | 8/2012 | Dua | |
| 8,279,611 B2 | 10/2012 | Wong et al. | |
| 8,339,258 B2 | 12/2012 | Rofougaran | |
| 2002/0058484 A1 * | 5/2002 | Bobier et al. | 455/108 |
| 2004/0214621 A1 | 10/2004 | Ponce De Leon et al. | |
| 2005/0140436 A1 | 6/2005 | Ichitsubo et al. | |
| 2006/0029229 A1 * | 2/2006 | Trifonov et al. | 380/256 |
| 2006/0038168 A1 | 2/2006 | Estes et al. | |
| 2006/0159158 A1 | 7/2006 | Moore et al. | |
| 2007/0024504 A1 | 2/2007 | Matsunaga | |
| 2007/0063056 A1 | 3/2007 | Gaucher et al. | |
| 2007/0229270 A1 | 10/2007 | Rofougaran | |
| 2007/0273476 A1 * | 11/2007 | Yamazaki et al. | 340/5.61 |
| 2007/0278632 A1 | 12/2007 | Zhao et al. | |
| 2008/0089667 A1 | 4/2008 | Grady et al. | |
| 2008/0112101 A1 | 5/2008 | McElwee et al. | |
| 2008/0150799 A1 | 6/2008 | Hemmi et al. | |
| 2008/0150821 A1 | 6/2008 | Koch et al. | |
| 2008/0159243 A1 | 7/2008 | Rofougaran | |
| 2008/0192726 A1 | 8/2008 | Mahesh et al. | |
| 2008/0195788 A1 | 8/2008 | Tamir et al. | |
| 2008/0197973 A1 * | 8/2008 | Enguent | 340/10.1 |
| 2008/0290959 A1 | 11/2008 | Ali et al. | |
| 2009/0006677 A1 | 1/2009 | Rofougaran | |
| 2009/0009337 A1 | 1/2009 | Rofougaran | |
| 2009/0037628 A1 | 2/2009 | Rofougaran | |
| 2009/0075688 A1 | 3/2009 | Rofougaran | |
| 2009/0086844 A1 * | 4/2009 | Rofougaran | 375/295 |
| 2009/0094506 A1 | 4/2009 | Lakkis | |
| 2009/0111390 A1 * | 4/2009 | Sutton et al. | 455/77 |
| 2009/0175323 A1 | 7/2009 | Chung | |
| 2009/0218407 A1 | 9/2009 | Rofougaran | |
| 2009/0218701 A1 | 9/2009 | Rofougaran | |
| 2009/0236701 A1 | 9/2009 | Sun et al. | |
| 2009/0239392 A1 | 9/2009 | Sumitomo et al. | |
| 2009/0239483 A1 | 9/2009 | Rofougaran | |
| 2009/0245808 A1 | 10/2009 | Rofougaran | |
| 2009/0280765 A1 | 11/2009 | Rofougaran et al. | |
| 2009/0310649 A1 * | 12/2009 | Fisher et al. | 375/141 |
| 2010/0127804 A1 | 5/2010 | Vouloumanos | |
| 2010/0159829 A1 | 6/2010 | McCormack | |
| 2010/0202499 A1 * | 8/2010 | Lee et al. | 375/219 |
| 2010/0231452 A1 | 9/2010 | Babakhani et al. | |
| 2010/0277394 A1 | 11/2010 | Haustein et al. | |
| 2010/0283700 A1 | 11/2010 | Rajanish et al. | |
| 2010/0285634 A1 | 11/2010 | Rofougaran | |
| 2010/0297954 A1 | 11/2010 | Rofougaran et al. | |
| 2011/0044404 A1 * | 2/2011 | Vromans | 375/295 |
| 2011/0047588 A1 | 2/2011 | Takeuchi et al. | |
| 2011/0181484 A1 | 7/2011 | Pettus et al. | |
| 2011/0207425 A1 | 8/2011 | Juntunen et al. | |
| 2011/0285606 A1 | 11/2011 | De Graauw et al. | |
| 2011/0286703 A1 | 11/2011 | Kishima et al. | |
| 2011/0311231 A1 | 12/2011 | Ridgway et al. | |
| 2012/0028582 A1 | 2/2012 | Tandy | |
| 2012/0064664 A1 | 3/2012 | Yamazaki et al. | |
| 2012/0069772 A1 | 3/2012 | Byrne et al. | |
| 2012/0083137 A1 | 4/2012 | Rohrbach et al. | |
| 2012/0263244 A1 | 10/2012 | Kyles et al. | |
| 2012/0286049 A1 | 11/2012 | McCormack et al. | |
| 2012/0290760 A1 | 11/2012 | McCormack et al. | |
| 2012/0295539 A1 | 11/2012 | McCormack et al. | |
| 2012/0307932 A1 | 12/2012 | McCormack et al. | |
| 2012/0319496 A1 | 12/2012 | McCormack et al. | |
| 2012/0319890 A1 | 12/2012 | McCormack et al. | |
| 2013/0070817 A1 | 3/2013 | McCormack et al. | |
| 2013/0106673 A1 | 5/2013 | McCormack et al. | |
| 2013/0109303 A1 | 5/2013 | McCormack et al. | |
| 2013/0157477 A1 | 6/2013 | McCormack | |
| 2013/0183903 A1 | 7/2013 | McCormack et al. | |

FOREIGN PATENT DOCUMENTS

| | | |
|---|---|---|
| EP | 2 309 608 A1 | 4/2011 |
| EP | 2 360 923 A1 | 8/2011 |
| WO | 2011/114737 A1 | 9/2011 |
| WO | 2011/114738 A1 | 9/2011 |
| WO | 2012/129426 A3 | 9/2012 |
| WO | 2012/155135 A3 | 11/2012 |
| WO | 2012/174350 A1 | 12/2012 |
| WO | 2013/006641 A3 | 1/2013 |
| WO | 2013/040396 A1 | 3/2013 |
| WO | 2013/059801 A1 | 4/2013 |
| WO | 2013/059802 A1 | 4/2013 |
| WO | 2013/090625 A1 | 6/2013 |

OTHER PUBLICATIONS

Vahle Electrification Systems, "CPS Contactless Power System", Catalog No. 9d/E, 2004, 12 pages.

Future Technology Devices International Limited (FTDI), "Technical Note TN_113 Simplified Description of USB Device Enumeration", Doc. Ref. No. FT_000180, Version 1.0, Issue Date Oct. 28, 2009, 19 pages.

Lee W. Young, Authorized Officer, U.S. Patent and Trademark Office, "International Search Report" in connection with related PCT Patent App. No. PCT/US2013/027835, dated May 3, 2013, 4 pages.

Lee W. Young, Authorized Officer, U.S. Patent and Trademark Office, "Written Opinion of the International Searching Authority" in connection with related PCT Patent App. No. PCT/US2013/027835, dated May 3, 2013, 8 pages.

(56) References Cited

OTHER PUBLICATIONS

Márquez, T. López, Authorized Officer, European Patent Office, "International Search Report" in connection with related PCT Patent App. No. PCT/US2013/029469, dated Jun. 6, 2013, 5 pages.

Márquez, T. López, Authorized Officer, European Patent Office, "Written Opinion of the International Searching Authority" in connection with related PCT Patent App. No. PCT/US2013/029469, dated Jun. 6, 2013, 5 pages.

Jochen Helms, Authorized Officer, European Patent Office, "International Search Report" in connection with related PCT Patent App. No. PCT/US2013/023665, dated Jun. 20, 2013, 5 pages.

Jochen Helms, Authorized Officer, European Patent Office, "Written Opinion of the International Searching Authority" in connection with related PCT Patent App. No. PCT/US2013/023665, dated Jun. 20, 2013, 10 pages.

Eric A. Juntunen, "60 GHz CMOS Pico-Joule/Bit Oook Receiver Design for Multi-Gigabit Per Second Wireless Communications" thesis paper, Aug. 2008, 52 pages.

Murcia Martinez, J., Authorized Officer, European Patent Office, "International Search Report" in connection with related Application Serial No. PCT/US2012/040214, dated Aug. 21, 2012, 3 pages.

Murcia Martinez, J., Authorized Officer, European Patent Office, "Written Opinion of the International Searching Authority" in connection with related Application Serial No. PCT/US2012/040214, dated Aug. 21, 2012, 8 pages.

Ablerga, Vito, Authorized Officer, European Patent Office, "International Search Report" in connection with related Application Serial No. PCT/US2012/042616,, dated Oct. 1, 2012, 4 pages.

Ablerga, Vito, Authorized Officer, European Patent Office, "Written Opinion of the International Searching Authority" in connection with related Application Serial No. PCT/US2012/042616,, dated Oct. 1, 2012, 10 pages.

Cortes Rosa, Joao, Authorized Officer, European Patent Office, "International Search Report" in connection with related Application No. PCT/US2012/030166, dated Oct. 31, 2010, 6 pages.

Cortes Rosa, Joao, Authorized Officer, European Patent Office, "Written Opinion of the International Searching Authority" in connection with related Application No. PCT/US2012/030166, dated Oct. 31, 2010, 9 pages.

Helms, Jochen, Authorized Officer, European Patent Office, "International Search Report" in connection with related Application No. PCT/US2012/055488, dated Dec. 13, 2012, 4 pages.

Helms, Jochen, Authorized Officer, European Patent Office, "Written Opinion of the International Searching Authority" in connection with related Application No. PCT/US2012/055488, dated Dec. 13 2012, 8 pages.

Helms, Jochen, Authorized Officer, European Patent Office, "International Search Report" in connection with related Application No. PCT/US2012/045444, dated Jan. 21, 2013, 7 pages.

Helms, Jochen, Authorized Officer, European Patent Office, "Written Opinion of the International Searching Authority" in connection with related Application No. PCT/US2012/045444, dated Jan. 21, 2013, 9 pages.

Helms, Jochen, Authorized Officer, European Patent Office, "International Search Report" in connection with related Application No. PCT/US2012/037795, dated Jan. 21, 2013, 7 pages.

Helms, Jochen, Authorized Officer, European Patent Office, "Written Opinion of the International Searching Authority" in connection with related Application No. PCT/US2012/037795, dated Jan. 21, 2013, 12 pages.

Helms, Jochen, Authorized Officer, European Patent Office, "International Search Report" in connection with related Application No. PCT/US2012/061345, dated Jan. 24, 2013, 4 pages.

Helms, Jochen, Authorized Officer, European Patent Office, "Written Opinion of the International Searching Authority" in connection with related Application No. PCT/US2012/061345, dated Jan. 24, 2013, 7 pages.

Franz, Volker, Authorized Officer, European Patent Office, "International Search Report" in connection with related Application No. PCT/US2012/061346, dated Jan. 24, 2013, 5 pages.

Franz, Volker, Authorized Officer, European Patent Office, "Witten Opinion of the International Searching Authority" in connection with related Application No. PCT/US2012/061346, dated Jan. 24, 2013, 9 pages.

Bouhana, Emmanuel, Authorized Officer, European Patent Office, "International Search Report" in connection with related Application No. PCT/US2012/069576, dated May 2, 2013, 3 pages.

Bouhana, Emmanuel, Authorized Officer, European Patent Office, "Written Opinion of the International Searching Authority" in connection with related Application No. PCT/US2012/069576, dated May 2, 2013, 13 pages.

\* cited by examiner

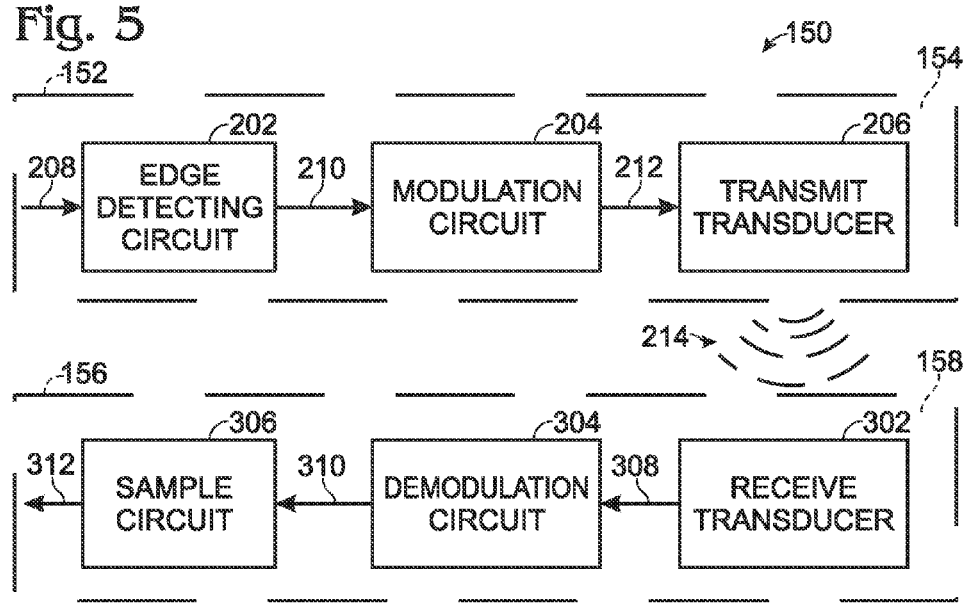
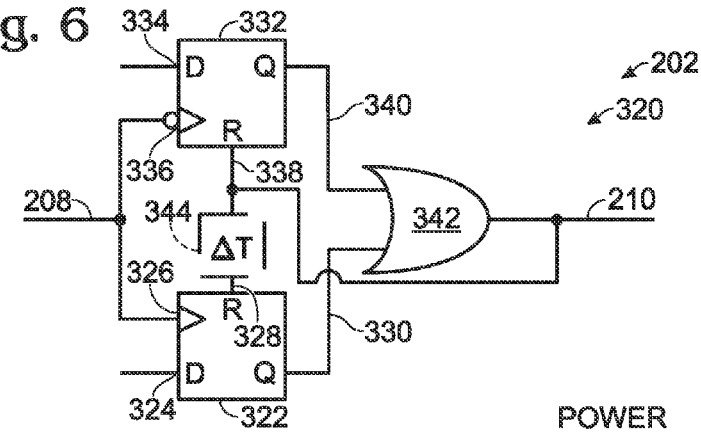
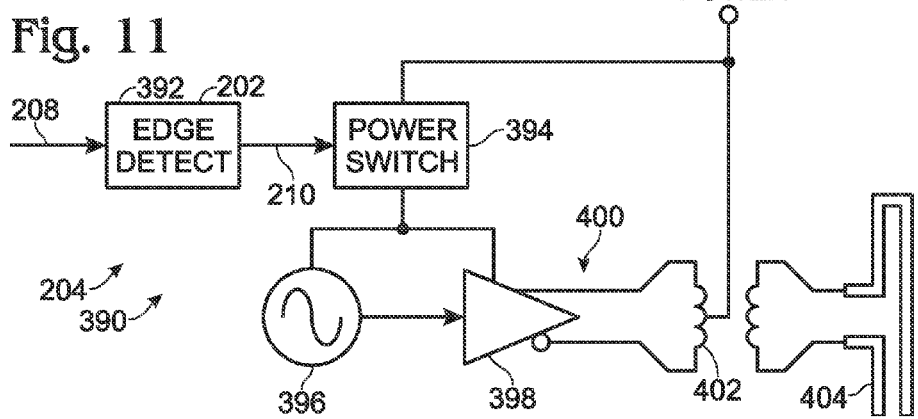

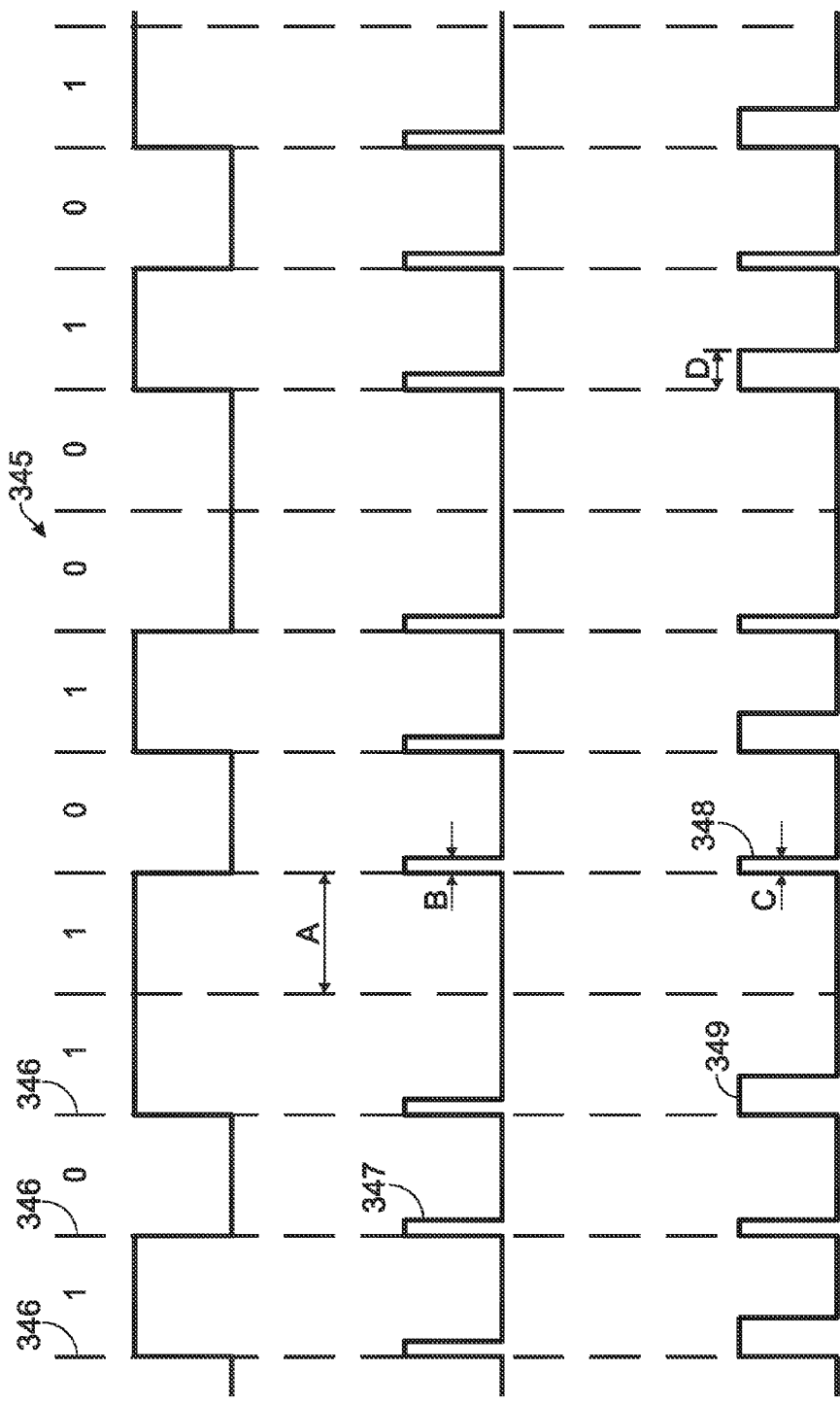

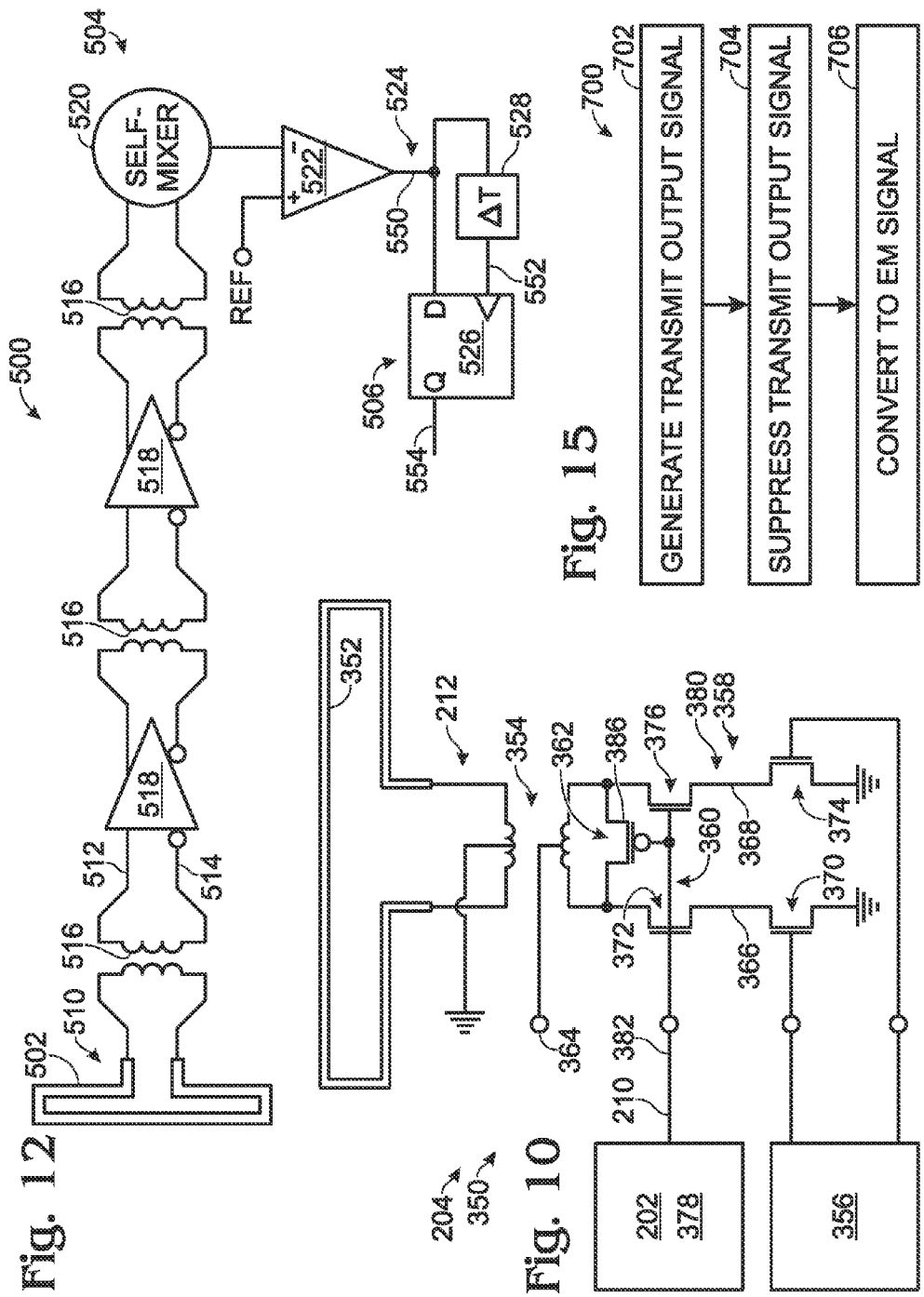

DELTA MODULATED LOW POWER EHF COMMUNICATION LINK

CROSS-REFERENCE TO RELATED APPLICATIONS

This application claims the benefit of U.S. Provisional Patent Application Ser. No. 61/491,811, filed on May 31, 2011 and entitled DELTA-MODULATED LOW-POWER EHF COMMUNICATION LINK, which application is incorporated herein by reference in its entirety for all purposes.

This application is also a continuation-in-part of U.S. patent application Ser. No. 13/427,576, filed Mar. 22, 2012 and entitled INTEGRATED CIRCUIT WITH ELECTROMAGNETIC COMMUNICATION.

FIELD OF THE DISCLOSURE

This disclosure relates to systems and methods for EHF communications, including modulation of EHF signals.

BACKGROUND OF THE DISCLOSURE

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

SUMMARY OF THE DISCLOSURE

In one example, a system for communicating modulated EHF signals may include a modulation circuit responsive to a bi-level transmit information signal for generating a transmit output signal having an EHF frequency when the transmit information signal is at a first information state and suppressing the transmit output signal when the transmit information signal is at a second information state different than the first information state. A transmit transducer operatively coupled to the modulation circuit may be responsive to the transmit output signal for converting the transmit output signal into an electromagnetic signal.

In another example, a system for communicating modulated EHF signals may include a receive transducer responsive to an electromagnetic signal having the EHF frequency for converting the electromagnetic signal into a receive input signal having a first signal strength for intermittent periods and a second signal strength less than the first signal strength otherwise. A demodulation circuit operatively coupled to the receive transducer may be responsive to the receive input signal for generating a receive information signal having a first information state when the receive input signal has the first signal strength and having a second information state when the receive input signal has the second signal strength.

In an exemplary method for communicating modulated EHF signals, a modulation circuit may generate a transmit output signal having an EHF frequency when a transmit information signal is at a first information state. The transmit output signal may be suppressed when the transmit information signal is at a second information state different than the first information state. A transmit transducer may convert the transmit output signal into an electromagnetic signal.

In another exemplary method for communicating modulated EHF signals, a receive transducer may receive an electromagnetic signal and convert the electromagnetic signal into a receive input signal having a first signal strength for intermittent periods and a second signal strength less than the first signal strength otherwise. A demodulation circuit responsive to the receive input signal may regenerate a receive information signal having a first information state when the receive input signal has the first signal strength and having a second information state when the receive input signal has the second signal strength.

Advantages of such systems and methods will be more readily understood after considering the drawings and the Detailed Description.

BRIEF DESCRIPTION OF THE DRAWINGS

FIG. 5 shows a block diagram of an exemplary communication system.

FIG. 6 is a circuit diagram of an illustrative edge detecting circuit.

FIG. 7 shows an illustrative data signal of FIGS. 5 and 6 representing binary information.

FIG. 8 shows an illustrative information signal for one example of the edge-detecting circuit of FIGS. 5 and 6.

FIG. 9 shows an illustrative information signal of another example of the edge-detecting circuit of FIGS. 5 and 6.

FIG. 10 is a circuit diagram of an illustrative modulation circuit and transducer.

FIG. 11 is a circuit diagram of another illustrative modulation circuit and transducer.

FIG. 12 is a circuit diagram of an illustrative demodulation and sampling circuit.

FIG. 15 shows an illustrative method for communicating an EHF signal using modulation.

DETAILED DESCRIPTION OF THE DISCLOSURE

Figure 1:
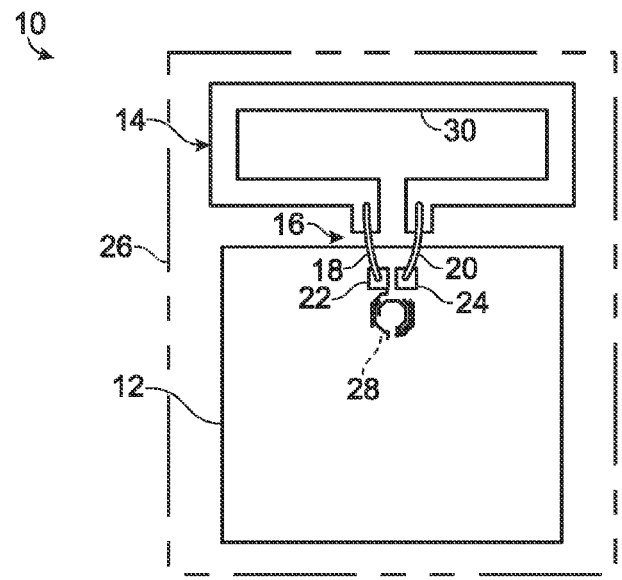
FIG. 1 shows a simplified schematic overhead view of a first example of an integrated circuit (IC) package including a die and antenna.

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may be discontiguous with respect to each other. In some examples, the transmitter and receiver may be disposed on separate circuit carriers positioned with the antennas of the transmitter/receiver pair in close proximity.

As discussed below, in one example a transmitter and/or receiver may be configured as an IC package, in which one or more antennas may be positioned adjacent to a die and held in place by a dielectric or insulating encapsulation or bond material. An antenna may also be held in place by a lead frame substrate. Examples of EHF antennas embedded in IC packages are shown in the drawings and described below. Note that IC packages may also be referred to as EHF IC packages or simply packages, and are examples of wireless communication units that are also variously referred to as EHF communication units, communication units, communication devices, comm-link chip packages, and/or comm-link packages.

FIG. 1 shows an exemplary IC package, generally indicated at 10. IC package 10 includes a chip or die 12, a transducer 14 providing conversion between electrical and electromagnetic (EM) signals, and conductive connectors 16, such as bond wires 18, 20 electrically connecting the transducer to bond pads 22, 24 connected to a transmitter or receiver circuit included in die 12. IC package 10 further includes an encapsulating material 26 formed around at least a portion of the die and/or the transducer. In this example encapsulating material 26 covers die 12, conductive connectors 16, and transducer 14, and is shown in phantom lines so that details of the die and transducer may be illustrated in solid lines.

Die 12 includes any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. Die 12 may have a length and a width dimension, each of which may be about 1.0 mm to about 2.0 mm, and preferably about 1.2 mm to about 1.5 mm. Die 12 may be mounted with further electrical conductors 16, such as a lead frame, not shown in FIG. 1, providing connection to external circuits. A transformer 28, shown in dashed lines, may provide impedance matching between a circuit on die 12 and transducer 14.

Transducer 14 may be in the form of a folded dipole or loop antenna 30, may be configured to operate at radio frequencies such as in the EHF spectrum, and may be configured to transmit and/or receive electromagnetic signals. Antenna 30 is separate from but operatively connected to die 12 by suitable conductors 16, and is located adjacent to die 12.

The dimensions of antenna 30 are suitable for operation in the EHF band of the electromagnetic frequency spectrum. In one example, a loop configuration of antenna 30 includes a 0.1 mm band of material, laid out in a loop 1.4 mm long and 0.53 mm wide, with a gap of 0.1 mm at the mouth of the loop, and with the edge of the loop approximately 0.2 mm from the edge of die 12.

Encapsulating material 26 is used to assist in holding the various components of IC package 10 in fixed relative positions. Encapsulating material 26 may be any suitable material configured to provide electrical insulation and physical protection for the electrical and electronic components of IC package 10. For example, encapsulating material 26, also referred to as insulating material, may be a mold compound, glass, plastic, or ceramic. Encapsulating material 26 may also be formed in any suitable shape. For example, encapsulating material 26 may be in the form of a rectangular block, encapsulating all components of IC package 10 except the unconnected ends of conductors 16 connecting the die to external circuits. External connections may be formed with other circuits or components.

Figure 2:
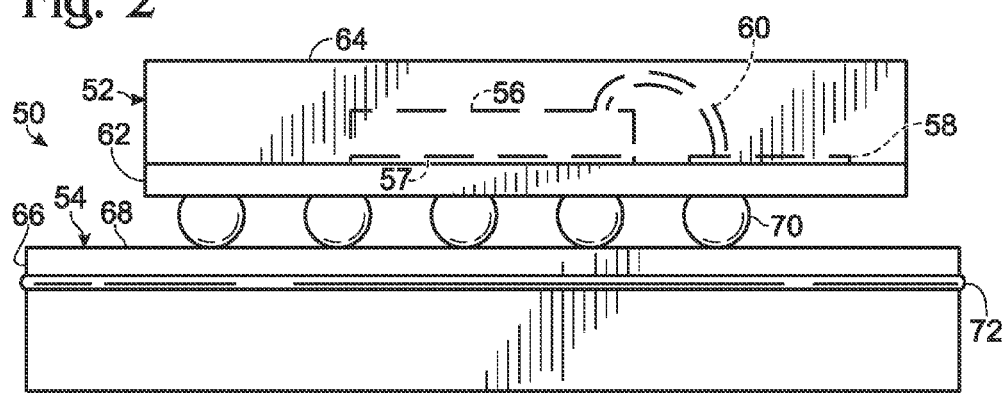
FIG. 2 shows a schematic side view of an exemplary communication device including an IC package and printed circuit board (PCB).

FIG. 2 shows a representational side view of a communication device 50 including an IC package 52 flip-mounted to an exemplary printed circuit board (PCB) 54. In this example, it may be seen that IC package 52 includes a die 56, a ground plane 57, an antenna 58, bond wires, including bond wire 60, connecting the die to the antenna. The die, antenna, and bond wires are mounted on a package substrate 62 and encapsulated in encapsulating material 64. Ground plane 57 may be mounted to a lower surface of die 56, and may be any suitable structure configured to provide an electrical ground for the die. PCB 54 may include a top dielectric layer 66 having a major face or surface 68. IC package 52 is flip-mounted to surface 68 with flip-mounting bumps 70 attached to a metallization pattern (not shown).

PCB 54 may further include a layer 72 spaced from surface 68 made of conductive material forming a ground plane within PCB 54. The PCB ground plane may be any suitable structure configured to provide an electrical ground to circuits and components on PCB 54.

Figure 3:
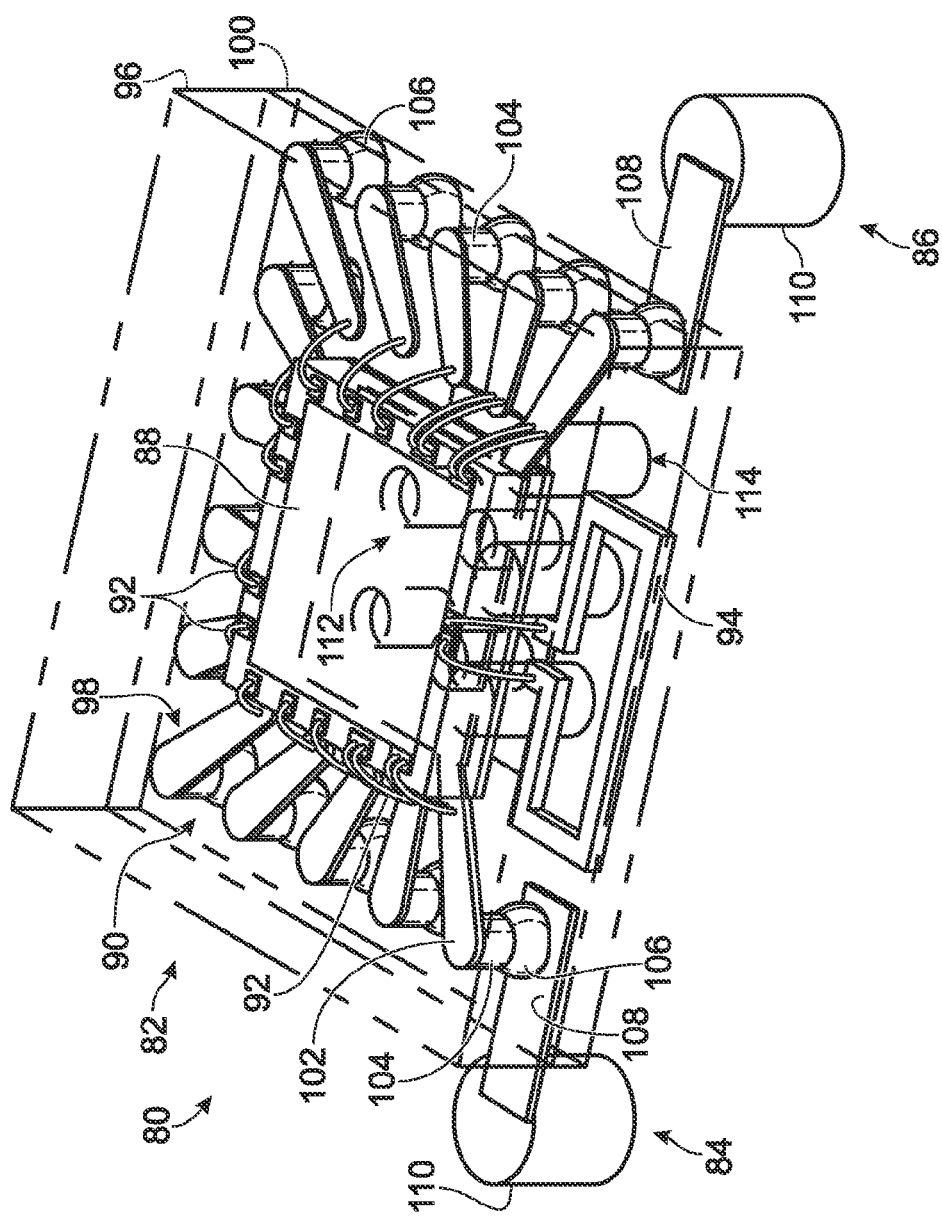
FIG. 3 shows an isometric view of another exemplary communication device including an IC package with external circuit conductors.
Figure 4:
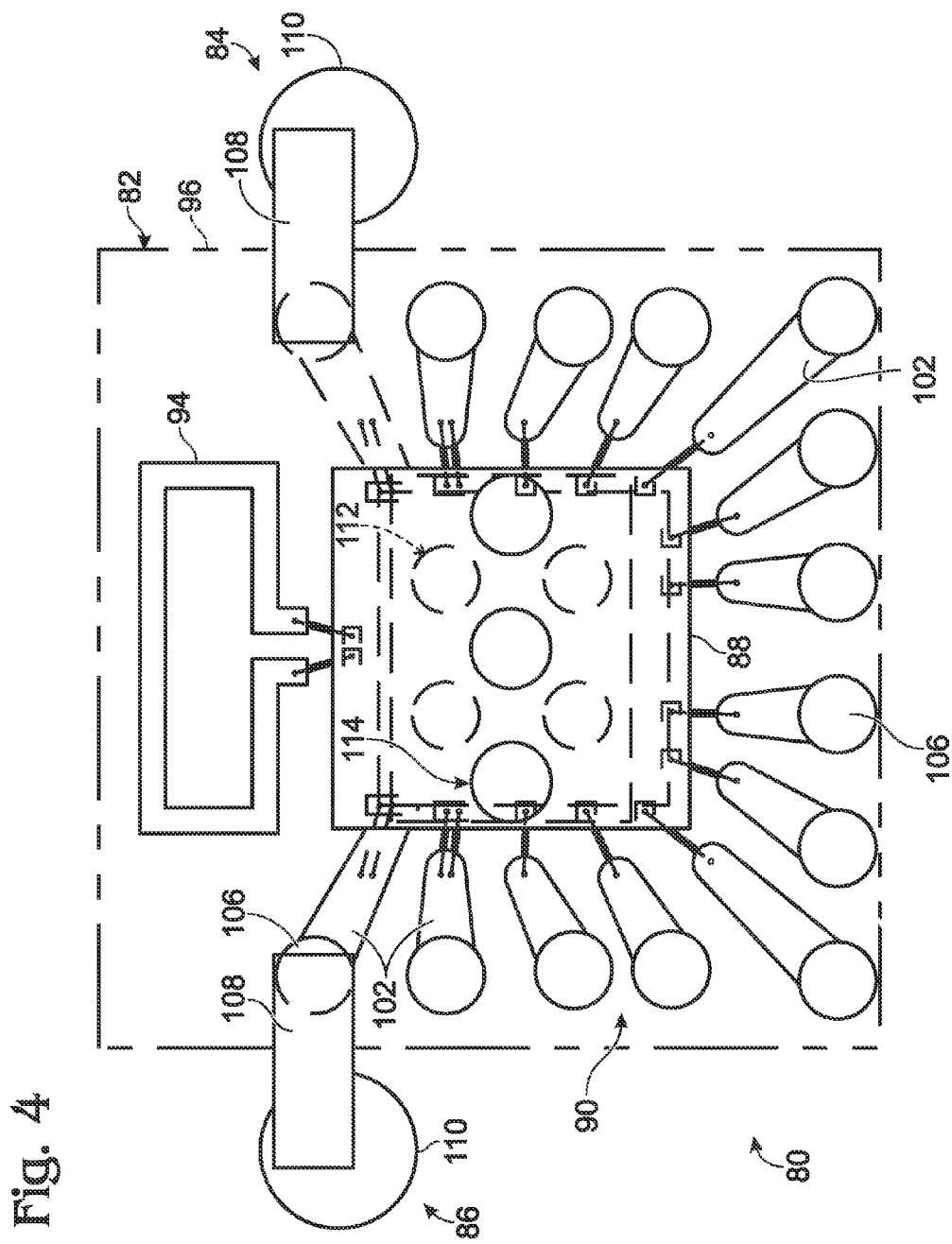
FIG. 4 shows a bottom view of the exemplary communication device of FIG. 3.

FIGS. 3 and 4 illustrate another exemplary communication device 80 including an IC package 82 with external circuit conductors 84 and 86. In this example, IC package 82 may include a die 88, a lead frame 90, conductive connectors 92 in the form of bond wires, an antenna 94, encapsulating material 96, and other components not shown to simplify the illustration. Die 88 may be mounted in electrical communication with lead frame 90, which may be any suitable arrangement of electrical conductors or leads 98 configured to allow one or more other circuits to operatively connect with die 90. Antenna 94 may be constructed as a part of the manufacturing process that produces lead frame 90.

Leads 98 may be embedded or fixed in a lead frame substrate 100, shown in phantom lines, corresponding to package substrate 62. The lead frame substrate may be any suitable insulating material configured to substantially hold leads 98 in a predetermined arrangement. Electrical communication between die 88 and leads 98 of lead frame 90 may be accomplished by any suitable method using conductive connectors 92. As mentioned, conductive connectors 92 may include bond wires that electrically connect terminals on a circuit of die 88 with corresponding lead conductors 98. For example, a conductor or lead 98 may include a plated lead 102 formed on an upper surface of lead frame substrate 100, a via 104 extending through the substrate, a flip-mounting bump 106 mounting IC package 82 to a circuit on a base substrate, such as a PCB, not shown. The circuit on the base substrate may include a external conductors, such as external conductor 84, which for example, may include a strip conductor 108 connecting bump 106 to a further via 110 extending through the base substrate. Other vias 112 may extend through the lead frame substrate 100 and there may be additional vias 114 extending through the base substrate.

In another example, die 88 may be inverted and conductive connectors 92 may include bumps, or die solder balls, as described previously, which may be configured to electrically connect points on a circuit of die 88 directly to corresponding leads 98 in what is commonly known as a "flip chip" arrangement.

A first and a second IC package 10 may be co-located on a single PCB and may provide intra-PCB communication. In other examples, a first IC package 10 may be located on a first PCB and a second IC package 10 may be located on a second PCB and may therefore provide inter-PCB communication.

In order to reduce power consumption and achieve other benefits, a data signal being communicated from one IC package 10 to another may be communicated by modulating a carrier signal to encode the data in the data signal. In some examples, a method of delta modulation may be used, such as by transmitting pulses of EHF radiation indicating that a transition in the binary data signal has occurred. These pulses may then be received by another IC package 10 and demodulated by translating the pulsed EHF signal again into a standard binary data signal for use in an electronic circuit. An IC package such as IC package 10 may include multiple circuits to carry out various functions related to transmission of modulated EHF signals and corresponding reception and demodulation of such signals.

FIG. 5 shows an exemplary communication system generally indicated at 150 including examples of circuits that may be included to facilitate communication using a modulated signal. As depicted in FIG. 5, a transmitter 152, which may be embodied in a transmitting IC package 154, may communicate with a receiver 156, which may be embodied in a receiving IC package 158. Transmitting IC package 154 and receiving IC package 158 may be examples of IC package 10. Transmitter 152 may include circuits such as an edge detecting circuit 202 operatively coupled with a modulation circuit 204 for providing an output signal to a transmit transducer 206. Receiver 154 may include a receive transducer 302 providing a signal to circuits such as a demodulation circuit 304 operatively coupled to a sample circuit 306.

Edge detecting circuit 202 may be any suitable electronic circuit configured to detect edge conditions in a binary data input signal 208 provided by a data signal source (not shown). Data input signal 208 may be any data-carrying binary electronic signal such as a non-return-to-zero (NRZ) data signal commonly utilized in modern electronics. Data input signal 208 may have two binary states, one representative of a data bit '1' and one representative of a data bit '0,' and may encode digital input data. Detecting edge conditions refers to detection of a transition from one binary state to another in data input signal 208, such as when the data input signal swings from one voltage level to another, such as from positive to negative and vice versa. Edge detecting circuit 202 may be configured to generate a bi-level transmit information signal 210 including an edge-indicating pulse generated in response to each transition between binary states in data input signal 208.

The transmit information signal 210 may be provided to modulation circuit 204. Modulation circuit 204 may be any suitable electronic circuit configured to be responsive to bi-level transmit information signal 210, and to generate a transmit output signal 212. Transmit output signal 212 may be produced by modulation circuit 204 as an electronic signal that has an EHF frequency when transmit information signal 210 is at a first information state, and suppressed by modulation circuit 204 when transmit information signal 210 is at a second information state. For example, transmit output signal 212 may be pseudo-intermittent, with a signal generated at an EHF frequency at the time and for the duration of a pulse in signal 210, and being suppressed otherwise, i.e., when no pulse is occurring in signal 210.

Modulation circuit 204 may be operatively coupled to transmit transducer 206, which may be an example of transducer 14, such that transmit output signal 212 may be converted from an electrical signal into an electromagnetic (EM) signal 214. For example, transducer 206 may be an antenna, such as a dipole antenna, sized and configured to operate in the EHF frequency range.

EM signal 214 may further be communicated to a second transducer such as receive transducer 302, which may be an example of transducer 14 on IC package 158. Receive transducer 302 may be an antenna configured to receive EHF signals such as EM signal 214. Transducer 302 may be configured to convert EM signal 214 into an electrical receive input signal 308. Receive input signal 308 may correspond to transmit output signal 212 in that the two electronic signals may be substantially identical due to having merely been translated through an intermediate EM signal. Accordingly, receive input signal 308 may have a first signal strength or amplitude with an EHF frequency at intermittent periods and a second signal strength or amplitude less than the first signal strength otherwise.

Demodulation circuit 304 may be operatively coupled to receive transducer 302. Demodulation circuit 304 may be any suitable circuit configured to respond to receive input signal 308 for generating a receive information signal 310 having two information states, one when the receive input signal 308 has the first signal strength and one when receive input signal 308 has the second signal strength. Receive information signal 310 may correspond to transmit information signal 210 in that it may be a bi-level signal including edge-indicating pulses that indicate each transition between binary states in a data signal being regenerated by receiver 156.

Sample circuit 306 may be coupled to demodulation circuit 304 and may be any suitable circuit configured to respond to receive information signal 310 for generating a data output signal 312 having a two binary states, one representative of a data bit '1' and one representative of a data bit '0.' Sample circuit 306 may generate a transition in the data output signal between the two states each time a pulse occurs in receive information signal 310. Data output signal 312 may correspond to data input signal 208 in that the digital information encoded by signal 312 will correspond to the digital information encoded by signal 208. The data output signal 312 may be provided to a data circuit (not shown) coupled to receiver 156.

FIG. 6 shows a simplified electronic circuit diagram of an exemplary edge detecting circuit 320, which is an example of an edge detecting circuit 202 described above. This example of an edge detecting circuit includes a D-type positive-edge flip-flop 322 having a D input 324 that receives a continuous logic '1' state, a clock input 328 that receives data input signal 208, and a reset input 328 that receives the bi-level transmit information signal 210. Positive-edge flip-flop 322 produces a first flip-flop output signal 330 in response to the states of the signals on D input 324, clock input 326, and reset input 328. Positive-edge flip-flop 322 may be any circuit or component configured to output the D value in response to a rising change in the clock input. In other words, in this example first flip-flop output signal 330 has the value '1' when data input signal 208 changes from low to high.

With continuing reference to FIG. 6, exemplary edge detecting circuit 320 also includes a negative-edge D-type negative-edge flip-flop 332 having a D input 334 that receives a continuous logic '1' state, a clock input 336 that receives a negative or complement of data input signal 208, and a reset input 338 configured to receive the bi-level transmit information signal 210. Negative-edge flip-flop 332 produces a second flip-flop output signal 340 in response to the states of the signals on D input 334, clock input 336, and reset input 338. Negative-edge flip-flop 332 may be any circuit or component configured to output the D value in response to a falling change in the clock input. In other words, second flip-flop output signal 340 will have a value '1' when data input signal 208 changes from high to low.

Still referring to FIG. 6, the output signals of flip-flops 322 and 332 both feed into an OR logic gate 342 that responds to the two signals 330 and 340 for producing transmit information signal 210. OR logic gate 342 may be any suitable circuit or component having two binary inputs and configured to generate a binary output that is high if either or both of the inputs are high, but generate a binary output that is low if both inputs are low. Accordingly, OR logic gate 342 in this example will cause transmit information signal 210 to be high when either of the flip-flop outputs 330 or 340 is high, and will cause transmit information signal 210 to be low when both of the flip-flop outputs 330 and 340 are low.

As described above, in addition to being provided to modulation circuit 204, transmit information signal 210 is also coupled to the reset inputs 328 and 338 of the flip-flops. This has the effect of resetting both flip-flops when either produces an output signal. Accordingly, any transition from low to high in transmit information signal 210 will be brief or pulsed, lasting only long enough to reset the flip-flops and cause the OR logic gate inputs to go low, thus causing the transmit information signal to go low as well.

From the above description, it may be seen that transmit information signal 210 may be a bi-level signal having a positive pulse corresponding to each of the transitions in data input signal 208 from '0' to '1' and from '1' to '0.'

In some examples, a delay component 344 is provided at the reset input 328 of positive-edge flip-flop 322 to delay the fed-back transmit information signal 210 by a predetermined amount. In these examples, resets of positive-edge flip-flop 322 will be delayed relative to resets of negative-edge flip-flop 332, causing output 330 to remain high longer than output 340 remains high. Accordingly, delay component 344 has the effect on transmit information signal 210 of causing the duration of each pulse caused by a rising data input signal 208 to be longer than the duration of each pulse caused by a falling data input signal 208. This may facilitate differentiation between the two types of pulses and embed additional information in transmit information signal 210 regarding data input signal 208.

FIGS. 7-9 are collectively a timing diagram showing an example of a data input signal 208 and two examples of transmit information signals 210 and 210', based on data input signal 208. Transmit information signal 210 is an example of an equal-pulse signal generated as described above in the discussion of FIG. 6 with no delay 344 at the input to positive edge flip-flop 322. Transmit information signal 210', on the other hand, is an example of an unequal-pulse signal generated with delay 344 implemented.

FIG. 7 shows data input signal 208 with a series of binary logic values 345 shown above corresponding portions of the signal encoding them. Dashed lines 346 indicate clock timing, with each dashed line 346 having a bit period of time of length A corresponding to a single bit. Data input signal 208 has a first binary state for bit period of time A when representative of a data bit '1' and a different binary state for bit period of time A when representative of a data bit '0.' As shown in the drawings, transitions exist between the first binary state and the second binary state.

FIG. 8 shows transmit information signal 210 produced by a non-delayed flip-flop in edge detect circuit 202. As depicted, each positive pulse 347 in signal 210 has a width B, which occurs at each transition in data input signal 208. Pulses 347 do not indicate whether a transition is positive-going or negative-going. Pulse width B is less than bit period of time A and may be approximately one-tenth of the width of bit period of time A.

FIG. 9 shows transmit information signal 210' produced by edge detect circuit 202 with delay component 344. As depicted, positive pulses 348 in signal 210' indicate a change to a value of '0' in signal 208 and have a pulse width C. However, positive pulses 349 indicate a change to a value of '1' and have a pulse width D that is wider than pulse width C. Pulse width D may be longer than pulse width C by the same length of time as the delay used in delay 344 for flip-flop 322.

Turning now to FIG. 10, an illustrative example of a modulation circuit 204 is generally indicated at 350, coupled to an antenna 352, which is an example of a transmit transducer 206. Similar to edge detecting circuits 202 and 320, modulation circuit 350 may be located on a die such as die 12 shown in FIG. 1, and may include a transformer 354, a carrier signal generator 356, an amplifier 358, a modulator 360, and a pinch device 362. In this example, transformer 354 may be any suitable transformer coupled to antenna 352 and may receive power on a primary winding from a terminal 364.

A carrier signal may be generated by carrier signal generator 356 and carried by a pair of signal conductors 366 and 368 between carrier signal generator 356 and antenna 352. Signal generator 356 may be any suitable component configured to generate an EHF-frequency carrier signal. For example, signal generator 356 may be a voltage controlled oscillator (VCO).

Amplifier 358 may include any suitable components configured to amplify the carrier signal generated by carrier signal generator 356. In the example depicted in FIG. 10, amplifier 358 is a cascode amplifier including two common-source field-effect transistors (FETs) 370 and 372 connected in series on signal conductor 366 and two common-source FETs 374 and 376 connected in series on signal conductor 368.

In the example depicted in FIG. 10, modulator 360 may receive a modulation signal from an edge detecting circuit 378, which is an example of edge detecting circuit 202. Modulator 360 may include FETs 372 and 376, which may be referred to as modulation FETs. Transmit information signal 210 may be conducted by a signal conductor 382 from edge detecting circuit 378 to the gates of FETs 372 and 376, thereby coupling edge detecting circuit 378 with modulation circuit 350. In this example, transmit information signal 210 modulates the carrier signal by causing FETs 372 and 376 to conduct at a high level when signal 210 is high and to conduct at a lower level or not at all when signal 210 is low. In so doing, FETs 372 and 376 may generate transmit output signal 212 as bursts having the EHF frequency of the carrier signal, with each burst representing a change in the state of the data input signal 208.

With continued reference to the example depicted in FIG. 10, pinch device 362 may be any suitable component configured to suppress or eliminate the transmit output signal 212 when transmit information signal 210 is low. For example, pinch device 362 may include a pinch switch or pinch FET 386 with a source and drain connected respectively to signal conductors 366 and 368. A complement of transmit information signal 210 is applied to the gate of pinch FET 386. Accordingly, pinch FET 386 conducts between source and drain when signal 210 is low, essentially shorting conductors 366 and 368 together. This in turn prevents the carrier signal from reaching transformer 354, thereby eliminating transmit output signal 212 between bursts. Conversely, FET 386 acts essentially as an open circuit when signal 210 is high, allowing operation of the modulation circuit to continue unimpeded.

As described above, signal 212 may be conducted via transformer 354 to antenna 352, where the electrical signal is converted to an EM signal and transmitted.

In other examples, modulation may be carried out as shown in the example of a modulation circuit 204 generally indicated at 390 in FIG. 11. In this example, an edge detect circuit 392 is operatively coupled to modulation circuit 390 through a power switch 394. In this example, when it is in a conducting state, power switch 394 provides power from a power source for a VCO 396 and an amplifier 398, which are analogous to the signal generator and amplification circuit of FIG. 10. Power switch 394 may be any suitable switch configured to conduct or prevent conduction of current based on a signal. For example, power switch 394 may be a FET controlled by a signal applied to the gate. In the example shown in FIG. 11, power switch 394 is controlled by transmit information signal 210 such that the switch conducts power when signal 210 is high. Amplifier 398 generates a bi-level transmit output signal 400 (analogous to signal 212) by turning power on and off to the carrier generator and/or the amplifier. In this example, the output of amplifier 398 is applied to a transformer 402 that feeds signal 400 to an antenna 404. Amplifier 398 may receive power from the power source through transformer 402 and also through power switch 394.

Figures 13, 14:
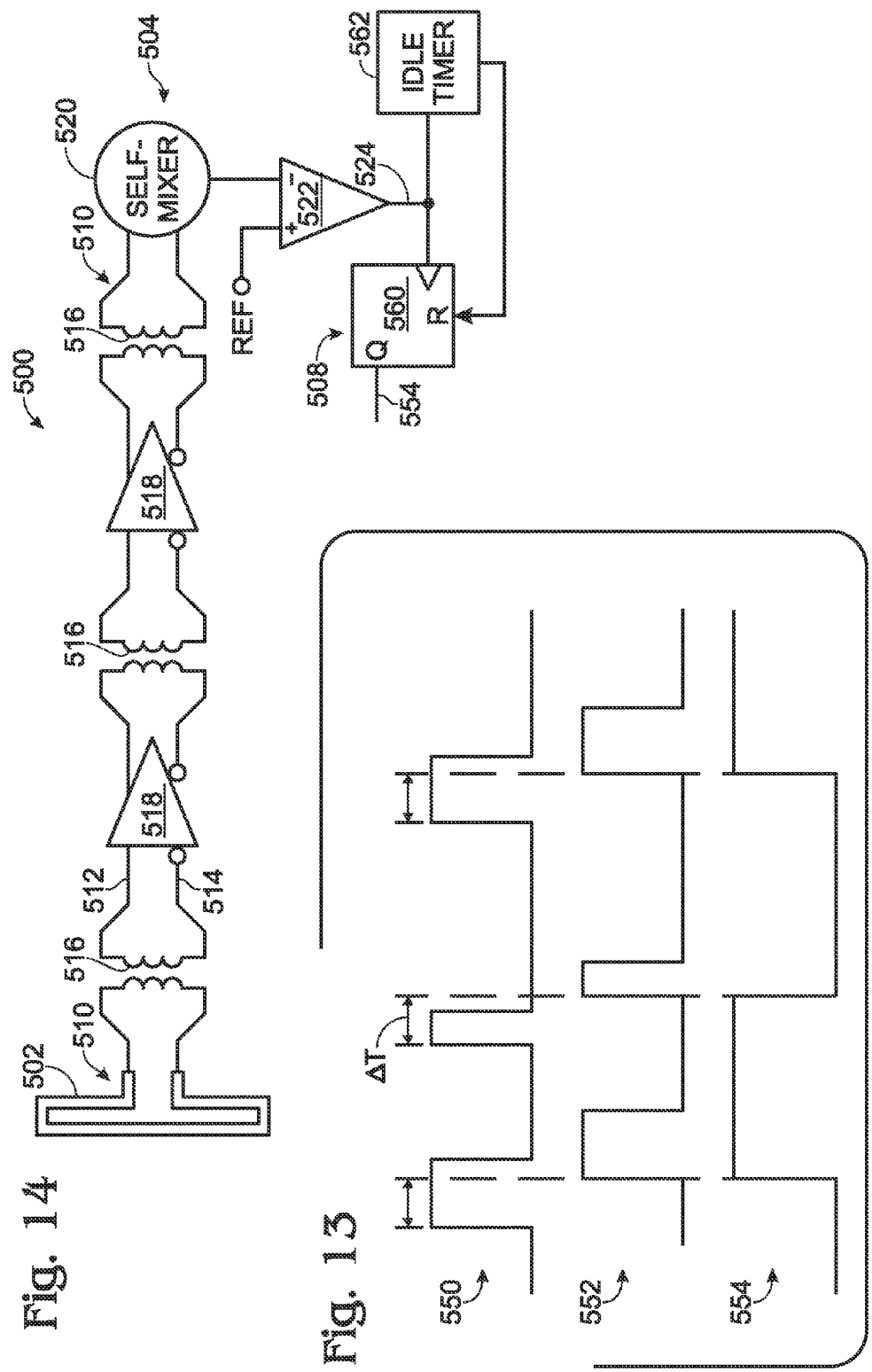
FIG. 13 shows an illustrative information signal converted to a corresponding illustrative data signal in a demodulation and sampling circuit.
FIG. 14 is a circuit diagram of another illustrative demodulation and sampling circuit.

Turning to FIGS. 12 and 14, examples of a circuit are generally indicated at 500. Circuits 500 include an antenna 502, which is an example of receive transducer 302, and a demodulation circuit 504, which is an example of demodulation circuit 304. The circuits of FIGS. 12 and 14 also include examples of sample circuit 306. FIG. 12 shows a sample circuit 506 and FIG. 14 shows an alternative sample circuit 508.

Antenna 502 may receive a modulated EM signal such as EM signal 214, and convert the EM signal to a receive input signal 510 (analogous to signal 308), which is carried on signal conductors 512 and 514. Signal 510 is passed through demodulation circuit 304, which includes a series of transformers 516 and amplifiers 518 to boost the signal strength, and a self mixer 520. Self mixer 520 responds to the amplified receive input signal 510 by mixing the EHF signal with itself to generate a base signal. In mixing the signal with itself, the carrier frequency is effectively doubled. Because the carrier is already in the EHF range, a doubling raises this frequency to a point where it will be substantially attenuated naturally by natural parasitic features of the circuit, leaving only a base signal.

The base signal is then passed to a comparator 522. Comparator 522 may be any suitable component configured to compare the base signal to a reference level, or threshold, and to generate a receive information signal 524 (analogous to signal 310) having a binary logic value '1' if the threshold is met, and to binary logic value '0' if the threshold is not met.

In sample circuit 506 shown in FIG. 12, receive information signal 524 is passed to the D input of a D-type flip-flop 526. Signal 524 is also passed to the clock input of flip-flop 526, but through a delay device 528 that delays the signal by a predetermined amount greater than the duration of a pulse indicating a value of '0' in the original data input signal but less than the duration of a pulse indicating a value of '1'. This configuration allows the circuit to differentiate between the two types of pulses shown in FIG. 9. As shown in FIG. 13, the D input has the output of the comparator and the clock input has the delayed output of the comparator. A pulse corresponding to a '1' will still be in progress at D when the delayed pulse hits the clock input. However, a shorter pulse corresponding to a '0' will be over by the time the same pulse reaches the clock input. This results in flip-flop 526 generating a data output signal 554 (analogous to signal 312) having the form shown at the bottom of FIG. 13.

In the alternative example of sample circuit 508 depicted in FIG. 14, receive information signal 524 is passed to the input of a toggle-type flip-flop 560. In this case, information signal 524 corresponds to information signal 210 shown in FIG. 8, and no delay is used and the pulses of signal 524 have the same duration. Since the pulses have the same duration, no differentiation is inherently possible between those indicating a '1' and those indicating a '0.' In this example, a pulse corresponding to a positive going transition may be identified by a unique code included in the data stream, which may be provided and detected by conventional means. All following pulses indicate a transition between the two logic states. An idle timer 562 also may be used to reset flip-flop 560 after a certain predetermined idle time, which may be indicated by a certain length of a series of '0' values (i.e., no pulses). Idle timer 562 may be reset by each signal pulse, indicating a value of '1.'

FIG. 15 is a block diagram depicting an exemplary method generally indicated at 700 for modulating EHF signals as is provided by transmitter 152. A first step 702 may include generating by a modulation circuit a transmit output signal having an EHF frequency when a transmit information signal is at a first information state. A second step 704 may include suppressing the transmit output signal when the transmit information signal is at a second information state different than the first information state. A third step 706 may include converting by a transmit transducer the transmit output signal into an electromagnetic signal.

Accordingly, a system or method as described above for delta modulated EHF communication may include one or more of the following examples.

In one example, a system for communicating modulated EHF signals may include a modulation circuit responsive to a bi-level transmit information signal for generating a transmit output signal having an EHF frequency when the transmit information signal is at a first information state and suppressing the transmit output signal when the transmit information signal is at a second information state different than the first information state. A transmit transducer operatively coupled to the modulation circuit may be responsive to the transmit output signal for converting the transmit output signal into an electromagnetic signal.

An edge-detecting circuit may be responsive to a binary data input signal for generating the bi-level transmit information signal. The data input signal may have a first binary state for a bit period of time when representative of a data bit '1' and a second binary state for the bit period of time when representative of a data bit '0,' there being transitions between the first binary state and the second binary state. The edge-detecting circuit may generate the bi-level transmit information signal including an edge-indicating pulse generated in response to each transition in the data input signal between the first and second binary states. The first information state of the transmit information signal may be the state when the edge-indicating pulse is occurring.

The edge-indicating pulse may have a duration less than the bit period of time, and may be less than one-tenth of the bit period of time.

The edge-detecting circuit may include a D-type positive-edge flip-flop having a first D input that is at a continuous logic '1' state, a first clock input for receiving the data input signal, and a first reset input for receiving the bi-level transmit information signal. The positive-edge flip-flop may produce a first flip-flop output signal in response to the states of the signals on the first D input, the first clock input, and the first reset input. The edge-detecting circuit may also include a D-type negative-edge flip-flop having a second D input that is at a continuous logic '1' state, a second clock input receiving the complement of the data input signal, and a second reset input for receiving the bi-level transmit information signal. The negative-edge flip-flop may produce a second flip-flop output signal in response to the states of the signals on the second D input, the second clock input, and the second reset input. The edge-detecting circuit may also include an OR logic gate responsive to the first and second flip-flop output signals for producing the bi-level transmit information signal.

The bi-level information signal may be delayed by a first delay prior to being applied to the first reset input, and may have first edge-indicating pulses corresponding to positive-going transitions in the data input signal. The first edge-indicating pulses each may have a longer duration than each of second edge-indicating pulses corresponding to negative-going transitions.

The system may include a receive transducer responsive to the electromagnetic signal for converting the electromagnetic signal into a receive input signal corresponding to the transmit output signal. The receive input signal may have a first signal strength at intermittent periods and a second signal strength less than the first signal strength otherwise. The system may also include a demodulation circuit operatively coupled to the receive transducer and responsive to the receive input signal for regenerating a receive information signal having a third information state when the receive input signal has the first signal strength and having a fourth information state when the receive input signal has the second signal strength.

The system may also include a sample circuit coupled to the demodulation circuit. The sample circuit may be responsive to the receive information signal for generating a data output signal having a third binary state for a bit period of time when representative of a data bit '1' and a fourth binary state for the bit period of time when representative of a data bit '0.' The sample circuit may generate a transition in the data output signal between the third and fourth binary states each time the receive information signal has the third information state.

The sample circuit may include a D-type receive flip-flop receiving the receive information signal on a D input and a clock input, with the receive information signal on the clock input being delayed by a second delay that includes at least the first delay. The sample circuit may produce the output data signal with a transition from the fourth binary state to the third binary state when the receive information signal has the third information state for a duration longer than the first delay.

The edge-detecting circuit may generate the bi-level information signal with edge-indicating pulses corresponding to positive-going transitions in the data input signal that have durations that are different than durations of edge-indicating pulses corresponding to negative-going transitions.

The system may include a receive transducer responsive to the electromagnetic signal for converting the electromagnetic signal into a receive input signal corresponding to the transmit output signal, the receive input signal having a first signal strength at intermittent periods and a second signal strength less than the first signal strength otherwise. The system may also include a demodulation circuit operatively coupled to the receive transducer and responsive to the receive input signal for regenerating a receive information signal having a third information state when the receive input signal has the first signal strength and having a fourth information state when the receive input signal has the second signal strength.

A sample circuit may be coupled to the demodulation circuit, the sample circuit being responsive to the receive information signal for generating a binary data output signal having a third binary state and a fourth binary state different than the third binary state, the sample circuit generating a transition in the data output signal between the third and fourth binary states each time the receive information signal has the third information state.

The modulation circuit may include a carrier signal generator for generating a carrier signal and a cascode amplifier in communication with the transmit transducer for amplifying the carrier signal received by the cascode amplifier.

The modulation circuit may further include a pair of common-source FETs operating in parallel with one common-source FET receiving a carrier signal that is the negative of a carrier signal that is received by the other common-source FET.

The modulation circuit may further include a pair of signal conductors coupling the carrier signal between the carrier signal generator and the transmit transducer. The cascode amplifier may include a pair of modulation FETs, one modulation FET in series with each conductor of the pair of signal conductors. The pair of modulation FETs may modulate the carrier signal in response to the transmit information signal.

The modulation circuit may include a carrier signal generator coupled to the transmit transducer and a pinch device responsive to the transmit information signal for suppressing the carrier signal when the transmit information signal is in the second information state.

The modulation circuit may include a pair of signal conductors coupling the transmit output signal between the pinch device and the transmit transducer, the pinch device further comprising a pinch switch for shorting the pair of signal conductors when the transmit information signal is in the second information state.

The modulation circuit may include a cascode amplifier in communication with the transmit transducer for amplifying the carrier signal.

The modulation circuit may further include a pair of signal conductors coupling the carrier signal between the carrier signal generator and the transmit transducer. The cascode amplifier may include a pair of modulation FETs, one modulation FET in series with each conductor of the pair of signal conductors, the pair of modulation FETs modulating the carrier signal in response to the transmit information signal.

The modulation circuit may include a carrier signal generator coupled to the transmit transducer for generating a carrier signal, a cascode amplifier for amplifying the carrier signal, and a power switch for coupling a power source to at least one of the carrier signal generator and the cascode amplifier. The power switch may terminate power to the at least one of the carrier signal generator and the cascode amplifier when the transmit information signal is in the second information state.

In another example, a system for communicating modulated EHF signals may include a receive transducer responsive to an electromagnetic signal having the EHF frequency for converting the electromagnetic signal into a receive input signal having a first signal strength for intermittent periods and a second signal strength less than the first signal strength otherwise. A demodulation circuit operatively coupled to the receive transducer may be responsive to the receive input signal for generating a receive information signal having a first information state when the receive input signal has the first signal strength and having a second information state when the receive input signal has the second signal strength.

A sample circuit may be coupled to the demodulation circuit, the sample circuit being responsive to the receive information signal for generating a binary data output signal having a first binary state and a second binary state different than the first binary state. The sample circuit may generate a transition in the data output signal between the first and second binary states each time the receive information signal has the first information state.

The electromagnetic signal may have edge-indicating pulses corresponding to positive-going transitions in a data input signal that have a duration longer than edge-indicating pulses corresponding to negative-going transitions by a first delay. The sample circuit may include a D-type receive flip-flop receiving the receive information signal on a D input and on a clock input. The receive information signal on the clock input may be delayed by a second delay that includes at least the first delay. The flip-flop may produce the output data signal with a transition from the second binary state to the first binary state when the receive information signal has the first information state for a duration longer than the first delay.

In an exemplary method for communicating modulated EHF signals, a modulation circuit may generate a transmit output signal having an EHF frequency when a transmit information signal is at a first information state. The transmit output signal may be suppressed when the transmit information signal is at a second information state different than the first information state. A transmit transducer may convert the transmit output signal into an electromagnetic signal.

A data input signal may have a first binary state for a bit period of time when representative of a data bit '1' and a second binary state for the bit period of time when representative of a data bit '0,' there being transitions between the first binary state and the second binary state. An edge-detecting circuit may generate the transmit information signal including generating an edge-indicating pulse in response to each transition in the data input signal between the first and second binary states, the first information state of the information signal being the state when the edge-indicating pulse is occurring.

Generating an edge-indicating pulse may include generating an edge-indicating pulse having a duration that may be less than the bit period of time, and may be less than one-tenth of the bit period of time.

In the edge detecting circuit, a continuous logic '1' state may be input in a first D input of a D-type positive-edge flip-flop. The data input signal may be input in a first clock input of the positive-edge flip-flop. The bi-level information signal may be input in a first reset input of the positive-edge flip-flop. The positive-edge flip-flop may produce a first flip-flop output signal in response to the states of the signals on the first D input, the first clock input, and the first reset input. A continuous logic '1' state may be input on a second D input of a D-type negative-edge flip-flop. A complement of the data input signal may be input on second clock input of the negative-edge flip-flop. The bi-level information signal may be input on a second reset input of the negative-edge flip-flop. The negative-edge flip-flop may produce a second flip-flop output signal in response to the states of the signals on the second D input, the second clock input, and the second reset input. An OR logic gate may produce the transmit information signal in response to the first and second flip-flop output signals.

The bi-level information signal may be delayed by a first delay time prior to inputting the bi-level information signal in the first reset input. An OR logic gate may produce the bi-level information signal including producing the bi-level information signal with first edge-indicating pulses corresponding to positive-going transitions in the data input signal. Each of the first edge-indicating pulses may have a longer duration than each of second edge-indicating pulses corresponding to negative-going transitions in the data input signal.

A receive transducer may receive the electromagnetic signal and convert the electromagnetic signal into a receive input signal corresponding to the transmit output signal. The receive input signal may have a first signal strength for intermittent periods and a second signal strength less than the first signal strength otherwise. A demodulation circuit may be responsive to the receive input signal, and may regenerate a receive information signal having a third information state when the receive input signal has the first signal strength and having a fourth information state when the receive input signal has the second signal strength.

A sample circuit, in response to the receive information signal, may generate a binary data output signal having a third binary state and a fourth binary state. The binary data output signal may have a transition between the third and fourth binary states each time the receive information signal has the third information state.

The sample circuit may generate an output data signal including inputting on a D input of a D-type receive flip-flop the receive information signal, delaying the receive information signal by a second delay that includes at least the first delay, inputting the delayed receive information signal on a clock input of the receive flip-flop, and producing the output data signal with a transition from the fourth binary state to the third binary state when the receive information signal has the third information state for a duration longer than the first delay.

The bi-level information signal may be generated with first edge-indicating pulses corresponding to positive-going transitions in the data input signal. The first edge-indicating pulses each may have a duration different than a duration of each of second edge-indicating pulses corresponding to negative-going transitions.

A receive transducer may receive the electromagnetic signal and convert the electromagnetic signal into a receive input signal corresponding to the transmit output signal. The receive input signal may have a first signal strength for intermittent periods and a second signal strength otherwise. A demodulation circuit may be responsive to the receive input signal, and may regenerate a receive information signal having a third information state when the receive input signal has the EHF frequency and having a fourth information state when the receive input signal has no frequency.

A sample circuit, in response to the receive information signal, may generate a binary data output signal having a third binary state and a fourth binary state different from the third binary state. The binary data output signal may have a transition between the third and fourth binary states each time the receive information signal has the third information state.

The modulation circuit may receive and amplify a carrier signal, and conduct the amplified carrier signal to the transmit transducer.

generating by the modulation circuit a carrier signal, conducting the carrier signal to the transmit transducer, and suppressing the carrier signal prior to conducting the carrier signal to the transmit transducer when the transmit information signal is in the second information state.

The transmit output signal may be coupled to the transmit transducer at least partially on a pair of signal conductors. The pair of signal conductors may be shorted when the transmit information signal is in the second information state.

The modulation circuit may amplify the carrier signal, and may conduct the amplified carrier signal to the transmit transducer.

Power may be supplied to the modulation circuit, and may be terminated to the modulation circuit in a manner preventing the transmit output signal from being transmitted to the transmit transducer when the transmit information signal is in the second information state.

In another exemplary method for communicating modulated EHF signals, a receive transducer may receive an electromagnetic signal and convert the electromagnetic signal into a receive input signal having a first signal strength for intermittent periods and a second signal strength less than the first signal strength otherwise. A demodulation circuit responsive to the receive input signal may regenerate a receive information signal having a first information state when the receive input signal has the first signal strength and having a second information state when the receive input signal has the second signal strength.

A sample circuit, in response to the receive information signal, may generate an output data signal having a first binary state and a second binary state. The output data signal may have a transition between the first and second binary states each time the receive information signal has the third information state.

The electromagnetic signal may have first edge-indicating pulses corresponding to positive-going transitions in a data input signal. Each of the first edge-indicating pulses may have a duration longer than each of second edge-indicating pulses corresponding to negative-going transitions by a first delay time. Generating by the sample circuit an output data signal may include inputting on a D input of a D-type receive flip-flop the receive information signal; delaying the receive information signal by a second duration that includes at least the first delay time; inputting the delayed receive information signal on a clock input of the receive flip-flop; and producing the output data signal with a transition from the second binary state to the first binary state when the receive information signal has the first information state for a duration longer than the first delay time.

INDUSTRIAL APPLICABILITY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

We claim:

1. A system for communicating modulated Extremely High Frequency (EHF) signals, comprising:
    a modulation circuit responsive to a bi-level transmit information signal for generating a transmit output signal having an EHF frequency when the transmit information signal is at a first information state and suppressing the transmit output signal when the transmit information signal is at a second information state different than the first information state;
    a transmit transducer operatively coupled to the modulation circuit and responsive to the transmit output signal for converting the transmit output signal into an electromagnetic signal;
    an edge-detecting circuit responsive to a binary data input signal for generating the bi-level transmit information signal, the data input signal having a first binary state for a bit period of time when representative of a data bit '1' and a second binary state for the bit period of time when representative of a data bit '0,' there being transitions between the first binary state and the second binary state, the edge-detecting circuit generating the bi-level transmit information signal including an edge-indicating pulse generated in response to each transition in the data input signal between the first and second binary states, the first information state of the transmit information signal being the state when the edge-indicating pulse is occurring; and
wherein the edge-detecting circuit includes:
    a D-type positive-edge flip-flop having a first D input that is at a continuous logic '1' state, a first clock input for receiving the data input signal, and a first reset input for receiving the bi-level transmit information signal, the positive-edge flip-flop producing a first flip-flop output signal in response to the states of the signals on the first D input, the first clock input, and the first reset input; and
    a D-type negative-edge flip-flop having a second D input that is at a continuous logic '1' state, a second clock input receiving the complement of the data input signal, and a second reset input for receiving the bi-level transmit information signal, the negative-edge flip-flop producing a second flip-flop output signal in response to the states of the signals on the second D input, the second clock input, and the second reset input; and
    an OR logic gate responsive to the first and second flip-flop output signals for producing the bi-level transmit information signal.

2. The system of claim 1, wherein the bi-level information signal is delayed by a first delay prior to being applied to the first reset input, the bi-level information signal having first edge-indicating pulses corresponding to positive-going transitions in the data input signal, the first edge-indicating pulses each having a longer duration than each of second edge-indicating pulses corresponding to negative-going transitions.

3. The system of claim 2, further comprising:
a receive transducer responsive to the electromagnetic signal for converting the electromagnetic signal into a receive input signal corresponding to the transmit output signal the receive input signal having a first signal strength at intermittent periods and a second signal strength less than the first signal strength otherwise; and
a demodulation circuit operatively coupled to the receive transducer and responsive to the receive input signal for regenerating a receive information signal having a third information state when the receive input signal has the first signal strength and having a fourth information state when the receive input signal has the second signal strength.

4. The system of claim 3, further comprising a sample circuit coupled to the demodulation circuit, the sample circuit being responsive to the receive information signal for generating a data output signal having a third binary state for a bit period of time when representative of a data bit '1' and a fourth binary state for the bit period of time when representative of a data bit '0,' the sample circuit generating a transition in the data output signal between the third and fourth binary states each time the receive information signal has the third information state.

5. The system of claim 4, wherein the sample circuit includes a D-type receive flip-flop receiving the receive information signal on a D input and a clock input, wherein the receive information signal on the clock input is delayed by a second delay that includes at least the first delay, and producing the output data signal with a transition from the fourth binary state to the third binary state when the receive information signal has the third information state for a duration longer than the first delay.

6. A system for communicating modulated Extremely High Frequency (EHF) signals, comprising:
a modulation circuit responsive to a bi-level transmit information signal for generating a transmit output signal having an EHF frequency when the transmit information signal is at a first information state and suppressing the transmit output signal when the transmit information signal is at a second information state different than the first information state;
a transmit transducer operatively coupled to the modulation circuit and responsive to the transmit output signal for converting the transmit output signal into an electromagnetic signal;
an edge-detecting circuit responsive to a binary data input signal for generating the bi-level transmit information signal, the data input signal having a first binary state for a bit period of time when representative of a data bit '1' and a second binary state for the bit period of time when representative of a data bit '0,' there being transitions between the first binary state and the second binary state, the edge-detecting circuit generating the bi-level transmit information signal including an edge-indicating pulse generated in response to each transition in the data input signal between the first and second binary states, the first information state of the transmit information signal being the state when the edge-indicating pulse is occurring; and
a receive transducer responsive to the electromagnetic signal for converting the electromagnetic signal into a receive input signal corresponding to the transmit output signal, the receive input signal having a first signal strength at intermittent periods and a second signal strength less than the first signal strength otherwise; and
a demodulation circuit operatively coupled to the receive transducer and responsive to the receive input signal for regenerating a receive information signal having a third information state when the receive input signal has the first signal strength and having a fourth information state when the receive input signal has the second signal strength.

7. The system of claim 6, further comprising a sample circuit coupled to the demodulation circuit, the sample circuit being responsive to the receive information signal for generating a binary data output signal having a third binary state and a fourth binary state different than the third binary state, the sample circuit generating a transition in the data output signal between the third and fourth binary states each time the receive information signal has the third information state.

8. A system for communicating modulated Extremely High Frequency (EHF) signals, comprising:
a modulation circuit responsive to a bi-level transmit information signal for generating a transmit output signal having an EHF frequency when the transmit information signal is at a first information state and suppressing the transmit output signal when the transmit information signal is at a second information state different than the first information state;
a transmit transducer operatively coupled to the modulation circuit and responsive to the transmit output signal for converting the transmit output signal into an electromagnetic signal;
wherein the modulation circuit includes a carrier signal generator for generating a carrier signal and a cascode amplifier in communication with the transmit transducer for amplifying the carrier signal received by the cascode amplifier; and
wherein the modulation circuit further includes a pair of common-source field-effect transistors (FETs) operating in parallel with one common-source FET receiving a carrier signal that is the negative of a carrier signal that is received by the other common-source FET.

9. The system of claim 8, wherein the modulation circuit further includes a pair of signal conductors coupling the carrier signal between the carrier signal generator and the transmit transducer, and wherein the cascade amplifier includes a pair of modulation field-effect transistors (FETs), one modulation FET in series with each conductor of the pair of signal conductors, the pair of modulation FETs modulating the carrier signal in response to the transmit information signal.

10. A system for communicating modulated Extremely High Frequency (EHF) signals, comprising:
a modulation circuit responsive to a bi-level transmit information signal for generating a transmit output signal having an EHF frequency when the transmit information signal is at a first information state and suppressing the transmit output signal when the transmit information signal is at a second information state different than the first information state;
a transmit transducer operatively coupled to the modulation circuit and responsive to the transmit output signal for converting the transmit output signal into an electromagnetic signal;
wherein the modulation circuit includes a carrier signal generator coupled to the transmit transducer and a pinch device responsive to the transmit information signal for suppressing the carrier signal when the transmit information signal is in the second information state; and wherein the modulation circuit includes a pair of signal conductors coupling the transmit output signal between the pinch device and the transmit transducer, the pinch device further comprising a pinch switch for shorting the pair of signal conductors when the transmit information signal is in the second information state.

11. A system for communicating modulated Extremely High Frequency (EHF) signals, comprising:
a modulation circuit responsive to a bi-level transmit information signal for generating a transmit output signal having an EHF frequency when the transmit information signal is at a first information state and suppressing the transmit output signal when the transmit information signal is at a second information state different than the first information state;
a transmit transducer operatively coupled to the modulation circuit and responsive to the transmit output signal for converting the transmit output signal into an electromagnetic signal;
wherein the modulation circuit includes a carrier signal generator coupled to the transmit transducer and a pinch device responsive to the transmit information signal for suppressing the carrier signal when the transmit information signal is in the second information state;
wherein the modulation circuit includes a cascode amplifier in communication with the transmit transducer for amplifying the carrier signal; and
wherein the modulation circuit further includes a pair of signal conductors coupling the carrier signal between the carrier signal generator and the transmit transducer, and the cascode amplifier includes a pair of modulation field-effect transistors (FETs), one modulation FET in series with each conductor of the pair of signal conductors, the pair of modulation FETs modulating the carrier signal in response to the transmit information signal.

12. A system for communicating modulated Extremely High Frequency (EHF) signals, comprising:
a receive transducer responsive to an electromagnetic signal having the EHF frequency for converting the electromagnetic signal into a receive input signal having a first signal strength for intermittent periods and a second signal strength less than the first signal strength otherwise; and
a demodulation circuit operatively coupled to the receive transducer and responsive to the receive input signal for generating a receive information signal having a first information state when the receive input signal has the first signal strength and having a second information state when the receive input signal has the second signal strength;
a sample circuit coupled to the demodulation circuit, the sample circuit being responsive to the receive information signal for generating a binary data output signal having a first binary state and a second binary state different than the first binary state, the sample circuit generating a transition in the data output signal between the first and second binary states each time the receive information signal has the first information state; and
where the electromagnetic signal has edge-indicating pulses corresponding to positive-going transitions in a data input signal that have a duration longer than edge-indicating pulses corresponding to negative-going transitions by a first delay, and wherein the sample circuit includes a D-type receive flip-flop receiving the receive information signal on a D input and on a clock input, wherein the receive information signal on the clock input is delayed by a second delay that includes at least the first delay, and producing the output data signal with a transition from the second binary state to the first binary state when the receive information signal has the first information state for a duration longer than the first delay.

13. A method for communicating modulated Extremely High Frequency (EHF) signals, comprising:
generating by a modulation circuit a transmit output signal having an EHF frequency when a transmit information signal is at a first information state;
suppressing the transmit output signal when the transmit information signal is at a second information state different than the first information state;
converting by a transmit transducer the transmit output signal into an electromagnetic signal;
wherein a data input signal has a first binary state for a bit period of time when representative of a data bit '1' and a second binary state for the bit period of time when representative of a data bit '0,' there being transitions between the first binary state and the second binary state;
generating by an edge-detecting circuit the transmit information signal including generating an edge-indicating pulse in response to each transition in the data input signal between the first and second binary states, the first information state of the information signal being the state when the edge-indicating pulse is occurring; and
wherein the generating by the edge-detecting circuit, the transmit information signal includes:
inputting in a first D input of a D-type positive-edge flip-flop a continuous logic '1' state;
inputting the data input signal in a first clock input of the positive-edge flip-flop;
inputting the bi-level information signal in a first reset input of the positive-edge flip-flop;
producing by the positive-edge flip-flop a first flip-flop output signal in response to the states of the signals on the first D input, the first clock input, and the first reset input;
inputting on a second D input of a D-type negative-edge flip-flop a continuous logic '1' state;
inputting on a second clock input of the negative-edge flip-flop the complement of the data input signal;
inputting on a second reset input of the negative-edge flip-flop the bi-level information signal;
producing by the negative-edge flip-flop a second flip-flop output signal in response to the states of the signals on the second D input, the second clock input, and the second reset input; and
producing by an OR logic gate the transmit information signal in response to the first and second flip-flop output signals.

14. The method of claim 13, further comprising delaying the bi-level information signal by a first delay time prior to inputting the bi-level information signal in the first reset input, and wherein producing by an OR logic gate the bi-level information signal includes producing by an OR logic gate the bi-level information signal with first edge-indicating pulses corresponding to positive-going transitions in the data input signal, each of the first edge-indicating pulses having a longer duration than each of second edge-indicating pulses corresponding to negative-going transitions in the data input signal.

15. The method of claim 13, further comprising:
delaying the bi-level information signal by a first delay time prior to inputting the bi-level information signal in the first reset input, and wherein producing by an OR logic gate the bi-level information signal includes producing by an OR logic gate the bi-level information signal with first edge-indicating pulses corresponding to positive-going transitions in the data input signal, each of the first edge-indicating pulses having a longer duration than each of second edge-indicating pulses corresponding to negative-going transitions in the data input signal;

receiving by a receive transducer the electromagnetic signal;

converting by the receive transducer the electromagnetic signal into a receive input signal corresponding to the transmit output signal, the receive input signal having a first signal strength for intermittent periods and a second signal strength less than the first signal strength otherwise; and regenerating by a demodulation circuit responsive to the receive input signal, a receive information signal having a third information state when the receive input signal has the first signal strength and having a fourth information state when the receive input signal has the second signal strength.

16. The method of claim 15, further comprising generating by a sample circuit in response to the receive information signal, a binary data output signal having a third binary state and a fourth binary state, the binary data output signal having a transition between the third and fourth binary states each time the receive information signal has the third information state.

17. The method of claim 16, wherein generating by the sample circuit an output data signal includes inputting on a D input of a D-type receive flip-flop the receive information signal; delaying the receive information signal by a second delay that includes at least the first delay; inputting the delayed receive information signal on a clock input of the receive flip-flop; and producing the output data signal with a transition from the fourth binary state to the third binary state when the receive information signal has the third information state for a duration longer than the first delay.

18. The method of claim 15, wherein generating the bi-level information signal includes generating the bi-level information signal with first edge-indicating pulses corresponding to positive-going transitions in the data input signal, the first edge-indicating pulses each having a duration different than a duration of each of second edge-indicating pulses corresponding to negative-going transitions.

19. The method of claim 15, further comprising: receiving by a receive transducer the electromagnetic signal; converting by the receive transducer the electromagnetic signal into a receive input signal corresponding to the transmit output signal, the receive input signal having a first signal strength for intermittent periods and a second signal strength otherwise; and regenerating by a demodulation circuit responsive to the receive input signal, a receive information signal having a third information state when the receive input signal has the EHF frequency and having a fourth information state when the receive input signal has no frequency.

20. The method of claim 19, further comprising generating by a sample circuit in response to the receive information signal, a binary data output signal having a third binary state and a fourth binary state different from the third binary state, the binary data output signal having a transition between the third and fourth binary states each time the receive information signal has the third information state.

21. A method for communicating modulated Extremely High Frequency (EHF) signals, comprising:

generating by a modulation circuit a transmit output signal having an EHF frequency when a transmit information signal is at a first information state;

suppressing the transmit output signal when the transmit information signal is at a second information state different than the first information state;

converting by a transmit transducer the transmit output signal into an electromagnetic signal;

generating by the modulation circuit a carrier signal, conducting the carrier signal to the transmit transducer, and suppressing the carrier signal prior to conducting the carrier signal to the transmit transducer when the transmit information signal is in the second information state; and coupling the transmit output signal to the transmit transducer at least partially on a pair of signal conductors, and shorting the pair of signal conductors when the transmit information signal is in the second information state.

22. The method of claim 21, further comprising applying power to the modulation circuit, and terminating power to the modulation circuit in a manner preventing the transmit output signal from being transmitted to the transmit transducer when the transmit information signal is in the second information state.

23. A method for communicating modulated Extremely High Frequency (EHF) signals, comprising:

receiving by a receive transducer an electromagnetic signal;

converting by the receive transducer the electromagnetic signal into a receive input signal having a first signal strength for intermittent periods and a second signal strength less than the first signal strength otherwise;

regenerating by a demodulation circuit responsive to the receive input signal, a receive information signal having a first information state when the receive input signal has the first signal strength and having a second information state when the receive input signal has the second signal strength;

generating by a sample circuit in response to the receive information signal, an output data signal having a first binary state and a second binary state, the output data signal having a transition between the first and second binary states each time the receive information signal has the third information state; and wherein the electromagnetic signal has first edge-indicating pulses corresponding to positive-going transitions in a data input signal, each of the first edge-indicating pulses having a duration longer than each of second edge-indicating pulses corresponding to negative-going transitions by a first delay time; and wherein generating by the sample circuit an output data signal includes inputting on a D input of a D-type receive flip-flop the receive information signal; delaying the receive information signal by a second duration that includes at least the first delay time; inputting the delayed receive information signal on a clock input of the receive flip-flop; and producing the output data signal with a transition from the second binary state to the first binary state when the receive information signal has the first information state for a duration longer than the first delay time.

* * * * *